United States Patent [19]

Galeuchet et al.

[11] Patent Number: 5,037,776

[45] Date of Patent: Aug. 6, 1991

[54] METHOD FOR THE EPITAXIAL GROWTH OF A SEMICONDUCTOR STRUCTURE

[75] Inventors: Yvan Galeuchet, Richterswil; Volker Graf, Wollerau; Wilhelm Heuberger, Richterswil; Peter Roentgen, Thalwil, all of Switzerland

[73] Assignee: International Business Machines Corporation, Armonk, N.Y.

[21] Appl. No.: 407,507

[22] Filed: Sep. 14, 1989

[30] Foreign Application Priority Data

Mar. 10, 1989 [EP] European Pat. Off. ........... 89810191

[51] Int. Cl.[5] .......................................... H01L 21/20
[52] U.S. Cl. ........................... 437/129; 148/DIG. 65; 148/DIG. 95; 156/610; 437/112; 437/132; 437/915; 437/970
[58] Field of Search ............... 148/DIG. 22, 25, 26, 148/50, 56, 57, 65, 72, 95, 119, 169; 156/610-614; 372/43, 46, 48; 427/248.1, 255.1; 437/81, 105, 107, 108, 110, 112, 126, 129, 132, 915, 970

[56] References Cited

U.S. PATENT DOCUMENTS

| | | | |
|---|---|---|---|
| 4,329,661 | 5/1982 | Sugino et al. | 372/46 |
| 4,358,850 | 11/1982 | Sagino et al. | 372/46 |
| 4,360,920 | 11/1982 | Wada et al. | 372/45 |
| 4,365,336 | 12/1982 | Sugino et al. | 372/46 |
| 4,380,861 | 4/1983 | Sugino et al. | 437/129 |
| 4,392,228 | 7/1983 | Okabe et al. | 357/17 |
| 4,542,511 | 9/1985 | Goodfellow et al. | 357/17 |
| 4,591,889 | 5/1986 | Gossard et al. | 357/4 |
| 4,788,159 | 11/1988 | Smith | 437/133 |
| 4,797,374 | 1/1989 | Scott et al. | 437/129 |

FOREIGN PATENT DOCUMENTS

| | | | |
|---|---|---|---|
| 0002658 | 7/1979 | European Pat. Off. | |
| 0110186 | 6/1984 | Japan | 437/90 |
| 0090426 | 5/1986 | Japan | 437/129 |
| 0296786 | 12/1986 | Japan | 437/129 |

OTHER PUBLICATIONS

Chen et al., "Embedded Epitaxial Growth of Low-Threshold GAInAsP/InP Injection Lasers", Appl. Phys. Lett., 38(5), 1 Mar. 1981, pp. 301-303.

"Growth Effects of $In_{0.53}Ga_{0.47}As$ ON InP Structured Substrates" by N. Chand et al., Electronics Lettersm, Jul. 8, 1982, vol. 18, No. 14, pp. 613-614.

"Single-Mode InGaAsP/InP Buried Waveguide Structures Grown on Channelled (111)B InP Substrates" by T. M. Benson et al., Electronics Letters, Sep. 16, 1982, vol. 18, No. 19, pp. 821-823.

"LPE Growth Effects of InP, $In_{0.53}Ga_{0.47}As$, and $In_{0.75}Ga_{0.25}As_{0.55}P_{0.45}$ on Structured InP Substrates" by N. Chaud et al., Journal of Crystal Growth 61 (1983) 53-60, North-Holland Publishing Company.

Applied Physics Letters, vol. 51, No. 19, 9th Nov. 1987, pp. 1518-1520.

Applied Physics Letters, vol. 49, No. 25, 22nd Dec. 1986, pp. 1738-1740.

*Primary Examiner*—Olik Chaudhuri
*Assistant Examiner*—William Bunch
*Attorney, Agent, or Firm*—Jeffrey L. Brandt; Richard A. Romanchik

[57] ABSTRACT

A method, and devices produced therewith, for the epitaxial growth of sub-micron semiconductor structures with at least one crystal plane-dependently grown, buried active layer (24) consisting of a III-V compound. The active layer (24) and adjacent embedding layers (23, 25) form a heterostructure produced in a one-step growth process not requiring removal of the sample from the growth chamber in between layer depositions. The layers of the structure are grown on a semiconductor substrate (21) having a structured surface exposing regions of different crystal orientation providing growth and no-growth-planes for the selective growth process. The method allows the production of multiple, closely spaced active layers and of layers consisting of adjoining sections having different physical properties.

9 Claims, 3 Drawing Sheets 5,037,776

METHOD FOR THE EPITAXIAL GROWTH OF A SEMICONDUCTOR STRUCTURE

TECHNICAL FIELD

The invention concerns a method for the epitaxial growth of a semiconductor structure with at least one crystal plane-dependently grown, buried active layer consisting of a III-V compound. The active layer and adjacent embedding layers form a heterostructure produced in a one-step growth process not requiring removal of the sample from the growth chamber inbetween layer depositions. The layers of the structure are grown on a semiconductor substrate having a structured surface exposing regions of different crystal orientation providing growth and no-growth-planes for the selective growth process. Also disclosed are buried heterostructure semiconductor devices that can be produced applying the inventive method.

BACKGROUND OF THE INVENTION

In today's semiconductor technology there is an increasing demand for still smaller structures resulting in faster devices and allowing for higher packaging densities. For electronic and optoelectronic devices this has lead to the development of buried heterostructures in which the active layer, serving e.g. as a FET channel or as the light emitting layer in a diode laser, is embedded in a material providing for electrical and/or optical confinement.

Classically, such buried structures have been realized using crystal growth processes requiring two or more steps with intermediate lithography and etching. However, since the interfaces are, prior to the second step, exposed to air or etchants, causing oxidation and contamination, and because a substrate cleaning process is not possible without destroying the created pattern, defect generation at these interfaces is a problem since yield, reliability and controllablity are seriously effected.

Therefore, one-step growth of buried heterostructures on patterned substrates has attracted much attention. When using, e.g., Liquid Phase Epitaxy (LPE) or Metal Organic Vapour Phase Epitaxy (MOVPE) processes, due to different growth mechanisms certain planes (such as (111) and (011)) act as no or low-growth planes for specific compounds (e.g., GaInAs) whereas other compounds (e.g. InP) grow non-selectively on all planes. This allows the in-situ burying of, e.g., low-gap material (GaInAs) into wide-gap material (InP) without contamination of the heterointerfaces.

For certain device designs, selective lateral epitaxial growth of semiconductor material in a one-step growth process is desirable. For LPE, such processes have been described in a number of publications for which the following are representative:

"Growth Effects of InGaAs on InP Structured Substrates" by N. Chand et al. (Electr. Lett., Vol. 18, No. 14, July 1982, pp. 613-614);

"Single Mode InGaAs/InP Buried Waveguide Structures grown on Channelled (111)B InP Substrates" by T. M. Benson et al. (Electr. Lett., Vol. 1 8, No. 19, Sept. 1982, pp. 812-813);

"LPE Growth Effects of InP, InGaAs, and InGaAsP on Structured InP Substrates" by N. Chand et al. (J. Crystal Growth, 61, 1983, pp. 53-60);

"Novel High-Speed InGaAs/InP Lateral Phototransistor" by N. Chand et al. (Electr. Lett., Vol. 21, No. 7, March 1985, pp. 308-310).

These references describe selective lateral growth of InGaAs and InGaAsP on sidewalls of channels etched into low-growth (111)B-oriented InP substrates. The selective growth occurs on the rounded channel sidewalls of undefined orientation. The use of such methods is limited because of the inherent limitations for small, high-speed devices. The active layer, grown on a rounded sidewall, is geometrically undefined and is not suitable for high-performance sub-micron devices. In addition, the highly super-saturated LPE process does not allow the growth of well-defined sub-micron epitaxy layers. The undefined geometry of the layers also prevents use in devices requiring the growth of closely-spaced multiple active layers, e.g., for laser array structures.

More recently, weakly super-saturated growth processes such as MOVPE, VPE or CBE have been developed. They allow the selective, crystal orientation dependent deposition of very thin layers, down to the sub-nm range. The state of the art is represented by the following articles:

"Selective Epitaxial Growth of GaAs by Low-Pressure MOVPE" by K. Kaman et al. (J. Cryst. Growth, 73, 1985, pp. 73-76);

"A Study of the Orientation Dependence of Ga(Al)As Growth by MOVPE" by S. Hersee et al. (J. Cryst. Growth, 77, 1986, pp. 310-320);

"A Novel Technology for Formation of a Narrow Active Layer in Buried Heterostructure Lasers by Single-Step MOCVD" by A. Yoshikawa et al. (IEEE J. Quantum Electronics, 23, June 1987, pp. 725-729);

"A Novel MOVPE Technology for a Single Stage Growth of Buried Ridge Double Heterostructure Lasers and Waveguides" by M. Scott et al. (MOVPE Conference Japan, 3. Cryst. Growth, 93, 1988, p. 820);

"Buried GaInAs/InP Layers grown on non-planar Substrates by one-step low-pressure Metal Organic Vapor Phase Epitaxy" by Y. Galeuchet et al. (Appl. Phys. Lett., Vol. 53, No. 26, Dec. 1988, p. 2638), and by the International Patent Application PCT-A-WO 87/00694 "Method for Producing a Heterostructure Device".

In these references growth processes for producing buried layer structures are described using selective growth techniques that allow one-step processes. In all tests made and for the applications proposed, the substrate is oriented such that the growth plane, normally (100)- oriented, is parallel to the initial unstructured horizontal substrate surface whereas the no-growth surfaces, mostly (111)-oriented planes revealed during a pre-epitaxial etching step, are inclined forming an angle with the horizontal substrate surface. In the resulting structures, the vertical dimension of the buried active layer is determined by an epitaxial growth step which can be accurately controlled. However, the process for determining the lateral, horizontal dimension either involves lithographic steps with their inherent limitations or requires complicated, low-yield processes virtually preventing the realization of well defined sub-micron buried structures in a production line. It has been found that these processes are, in fact, non-operational for very small dimensions (Article "Fabrication of Nanometer Width GaAs/AlGaAs Microelectronic Engineering 6 (1987), pp. 163-168). These processes are, furthermore, not suited for the fabrication of closely spaced multiple buried structures that are highly desired for a range of advanced high-performance devices.

SUMMARY OF THE INVENTION

It is a main object of the present invention to provide a one-step growth method for the fabrication of buried heterostructures with active layers of very small, quantum effect size dimensions that are well-defined in both the vertical and the lateral direction.

Another object is to provide a method for the fabrication of small semiconductor channels with dimensions determined with nm accuracy using simple processes that have proven to be reliable.

A further object is to provide a method allowing the fabrication of structures comprising multiple, closely spaced buried active layers with sub-micron dimensions.

Still another object is to provide high performance semiconductor devices such as FET's or diode lasers comprising well-defined sub-micron buried heterostructures.

The invention as claimed is intended to meet these objectives and to remedy the drawbacks and deficiencies of known buried structure methods and devices. The invention solves the problems hitherto encountered by growing the semiconductor structure, including the buried active layer, on a substrate which is oriented such that its surface is substantially parallel to a crystal plane on which the active layer will not grow. The surface is structured to provide at least one inclined side slope parallel to a crystal plane on which the active layer can grow at a substantial rate. Using a weakly super-saturated growth process such as MOVPE, a stack of layers is grown onto the structured substrate surface, the stack comprising one or more conformal layers, non-selectively grown, and, buried therein, the geometrically well-defined active layer or layers, selectively grown onto a growth plane side slope.

The advantages offered by the invention are mainly that the one-step growth technique allows the growth of buried active layers having very small, well-defined vertical and lateral dimensions, using easy-to-control processes with nm accuracy: the vertical dimension being determined by an etch process (used to structure the substrate surface) whereas the lateral dimension is determined by the epitaxial growth onto an inclined growth plane. The inventive selective growth method permits the realization of a wide range of devices requiring, for high performance, active layers of very small, quantum effect size dimensions. In case multiple layers are employed, these can be very closely spaced.

BRIEF DESCRIPTION OF THE DRAWINGS

The invention is described in detail below with reference to drawings which illustrate specific embodiments of the invention, and in which.

DETAILED DESCRIPTION

Embodiments of the invention will now be described, by way of example only, with reference to the accompanying drawings.

In FIGS. 1A to 1G, the successive steps of the inventive method applied to produce a buried layer heterostructure, are illustrated in detail. In the embodiment described with the aid of these figures, a GaInAs/InP material system is used: GaInAs forms the narrow bandgap active layer, whereas InP serves as wide bandgap material for the encapsulating layers burying the active layer. Under proper process conditions, GaInAs exhibits a crystal plane dependent growth behavior in that it will grow at a substantial rate on "growth planes", e.g., on (100)-oriented surfaces, but not on "no-growth" planes such as (111). In contrast thereto, InP grows plane independent forming layers conformal with the underlying structure.

Figure 1:
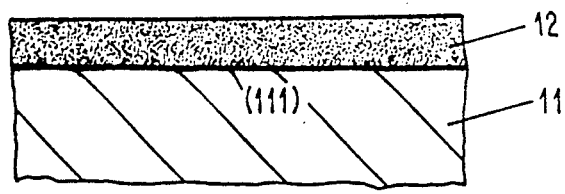
FIG. 1A-1G are cross-sectional illustrations of the steps of the inventive method applied to fabricate a buried, III-V compound active layer or channel.
Figure 1:
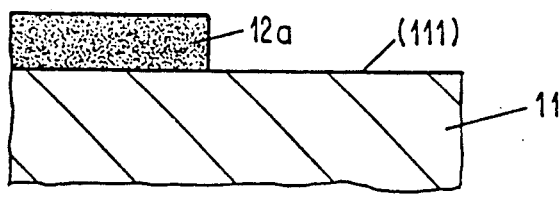
Figure 1:
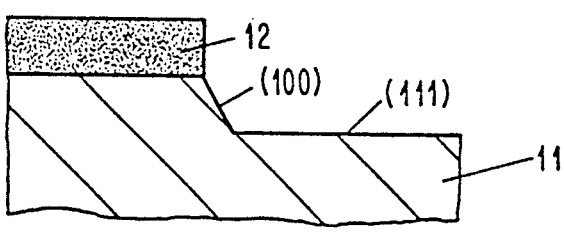
Figure 1:
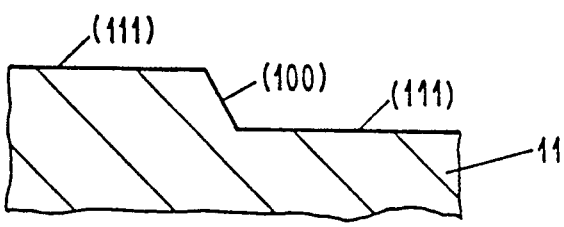
Figure 1:
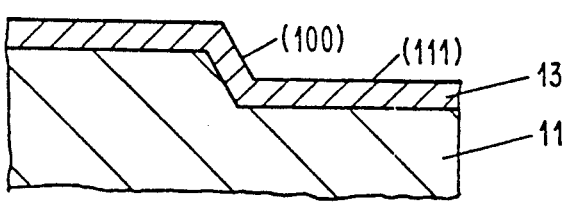
Figure 1:
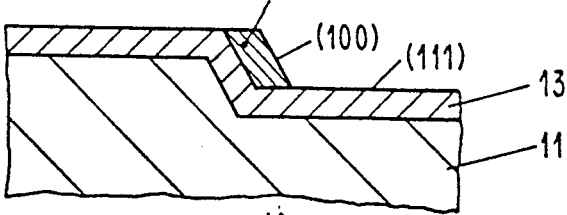
Figure 1:
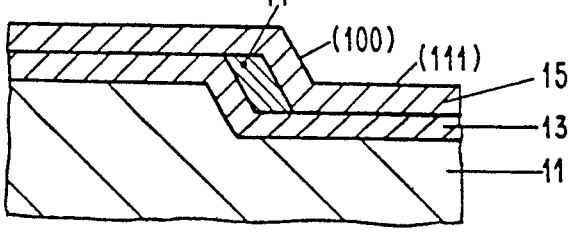

As illustrated in FIG. 1A, the process is initiated starting with a (111)-oriented InP substrate 11, i.e., its upper (111) surface represents a no-growth plane for GaInAs. Deposited on substrate 11 is a SiO2 layer 12 having a thickness of between 50 nm to several hundred nm.

Next, stripes are defined along the (110)-direction the SiO2 is selectively removed to obtain the etch mask 12a as shown in FIG. 1B. Either buffered HF or a reactive ion etch process is used.

Then, either in a wet chemical etch process, e.g., Br-Methanol, or, for even better geometrical control by reactive ion etching, e.g., CH4, a groove is etched into the InP substrate 11, the patterned SiO2 layer 12a serving as mask. Only the left hand sidewall or facet of the groove is shown in FIG. 1C. The etching conditions are selected such that the facet provides a growth plane for GaInAs, in the example (100).

Articles "LPE Growth Effects of InP, InGaAs, and InGaAsP on Structured InP Substrates" by N. Chand et al. (J. Crystal Growth, 61, 1983, pp. 53–60) and "A Novel Process for Reactive Ion Etching on InP, using CH4/H2" by U. Niggebruegge et al. (Inst. Phys. Conf. Ser. No. 79, 1986, pp. 367–372) describe typical processes that can be applied to obtain the desired substrate pattern.

After etching, SiO2 etch mask 12a is removed using buffered HF. The patterned substrate, shown in FIG. 1D, with horizontal (111) surfaces and inclined (100) facets, is then loaded into a conventional MOVPE growth chamber.

For the subsequent epitaxial growth processes, the following growth conditions and materials are chosen:

| | |
|---|---|
| Substrate temperature: | between 550 and 650 degree C.; |
| Group V sources: | PH3 and AsH3; |
| Group III sources: | Trimethyl compounds of Ga and In; |
| Group III flow: | low rate resulting in a growth rate of below 2 nm/s; |
| Group V flow: | a rate at least one hundred times higher than that of the group III compound |

| -continued |
|---|
| facilitates the plane selective growth. |

With these conditions, the layers of the buried layer structure are deposited as follows:

Conformal growth of an InP buffer layer 13 over the defined substrate surface pattern, i.e., on (111) planes as well as on (100) planes (FIG. 1E);

. After changing the gas composition: growth of the low gap GaInAs layer 14. Due to the incomplete decomposition and high mobility of growth species on the (111)-plane, growth of GaInAs proceeds locally only on the pre-defined (100) growth planes where the final decomposition occurs by surface catalytic enhanced reactions (FIG. 1F). Growth is continued until the desired lateral thickness of the active GaInAs layer 14 is obtained;

After changing the gas composition again : Growth of an InP capping layer 15. This layer grows conformal to the original substrate surface structure and hence completes the embedding of the GaInAs layer 14. (FIG. 1G).

The thickness of the various layers can be anywhere between about one nanometer and several micron. It is determined by the specific requirements for the device to be produced.

The foregoing process description is only exemplary of the inventive method. It should be noted that the materials used, the substrate orientation, the thicknesses and other dimensions as well as the process parameters are selected for clarity of illustration and are not to be interpreted in a limiting sense.

Particularly worth mentioning in this context is the choice of suitable materials. In the described example, GaInAs is used as narrow bandgap, selective growth material, InP as wide gap, conformal growth material. Another combination e.g., would be AlGaInP/GaAs.

Prerequisite for the inventive method is not only to provide a pair or set of materials for a heterostructure with layers having different physical properties such as bandgap, refractive index and/or doping. Neither is it sufficient to use a pair of materials where both exhibit the same plane dependent growth behavior. It is essential that the plane dependency of the growth of the materials can be individually adjusted so as to be different from each other. The simple AlGaAs/GaAs system, where crystal plane dependent growth is usually found to be similar for both, the wide gap AlGaAs and the narrow gap GaAs, would not provide the required difference in crystal orientation dependent growth.

Figure 2:
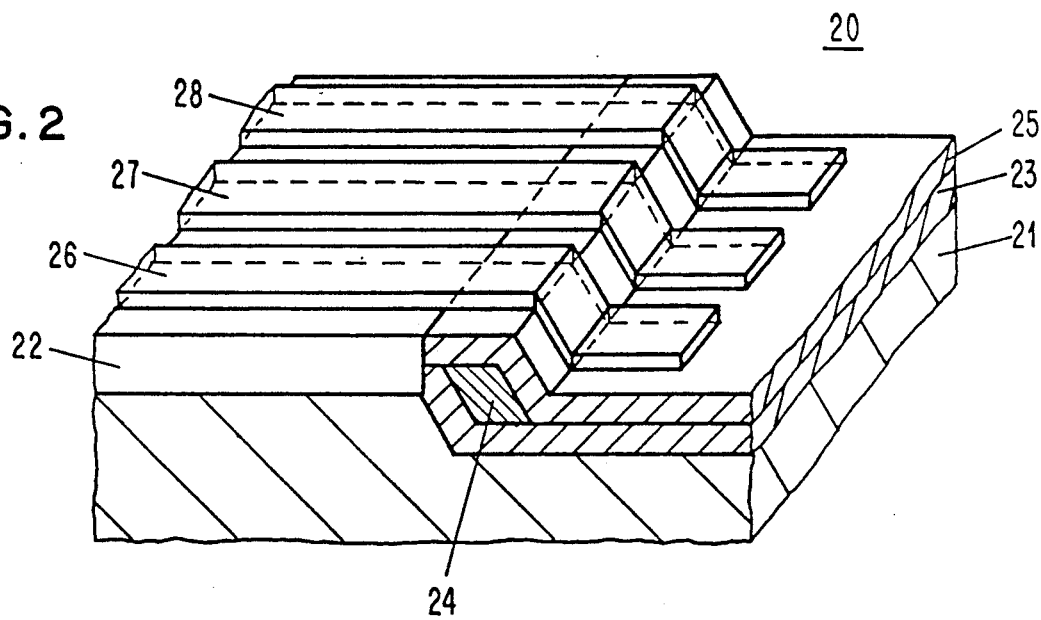
FIG. 2 is a perspective view of a selectively doped One-Dimensional Electron Gas (ODEG) FET produced in accordance with the invention.

FIG. 2 shows, perspectively, a field effect transistor 20 that can be fabricated with the inventive method. More particularly, the structure shown is a so-called One Dimensional Electron Gas field effect transistor (ODEG-FET).

The transition from the traditional MESFET towards the 2-dimensional electron gas FET (known as, e.g., MODFET or HEMT devices) has resulted in strongly enhanced device performance, particularly with respect to transit frequency and noise. Theoretical papers predict a further substantial improvement if the free motion of the carriers is reduced to 1 dimension. Reference is made to an article "Mobility in a Quasi-One-Dimensional Semiconductor: An Analytical Approach" by G. Fishman (Phys. Review B, Vol. 34, No. 4, Aug. 15, 1986, pp 2394-2401).

Despite some early pioneer work, an experimental verification has not yet been provided due to technological difficulties in the realization of highly conductive 1-dimensional selectively doped FET channels with quantum size effect dimensions of the order of below $50 \times 50$ nm.

The new process herein described allows the fabrication of such 1-dimensional devices. The principal processing sequence for the fabrication of the device shown in FIG. 2 corresponds to that used to produce the structure shown in FIG. 1G, with some particular requirements and deviations:

Again, an GaInAs/InP material system is chosen. A semi-insulating InP substrate 21 is used on which a high quality 100 nm SiO2 mask 22 is deposited and patterned (as illustrated in FIG. 1B). The subsequent etching into the InP substrate is controlled to obtain an etch depth of less than 50 nm (FIG. 1C). Contrary to the step represented in FIG. 1D, i.e., the complete removal of the etch mask, the mask 22 (FIG. 2) remains on the substrate during growth. Although not essential, this facilitates device fabrication and offers higher performance. After loading the sample into a growth chamber, the following layers are deposited under the same conditions as used for the process illustrated in FIGS. 1E, 1F and 1G:

Undoped InP buffer layer 23 is grown conformal to the patterned substrate; depending on growth conditions, either highly resistive poly material is deposited on mask 22, or there is no deposition at all on the SiO2. Both results are suitable for the further process.

Growth of an undoped GaInAs channel 24 (corresponding to layer 14 in FIG. 1F) on the revealed (100)-facet by plane selective growth. The growth time is adjusted to achieve a lateral GaInAs layer thickness on the (100)- facet of below 50 nm.

Growth of an n-doped InP conformal cap layer 25 of about 50 nm thickness covering the exposed semiconductor surface. This n-InP layer provides for two functions: (1) It acts as electron donator for the low gap 1-dimensional GaInAs channel 24, and (2) it buries the channel 24 into wide gap material (23 and 25) to channel.

After the growth process, a metallization layer is applied and standard source (26), gate (27) and drain (28) contacts are defined analog to the well known common FETs. This contact metallization is deposited onto the exposed semiconductor surfaces and either on the high resistive poly-InP that may cover the SiO2 mask 22 or directly on the SiO2 in case there had been no growth on the SiO2 surface during the InP growth step. Conformal layer 25 provides for low contact resistance to the source (26) and drain (28) metallization and a Schottky contact to the gate (27) metal.

Performance and advantages provided by such ODEG-FET devices are discussed in the above mentioned article by G. Fishman and are not discussed in detail here. The use of the one-step growth method in producing ODEG-FETs allows high drive currents since, due to the selective doping, high channel conductances can be achieved. Since the buried device, produced in one growth step, is free of surface and interface states, precise control over the channel pinch-off and turn-on is possible. If even even lower impedances are required, a plurality of channels could be realized by growing several layer sequences as will be described below.

Figure 3:
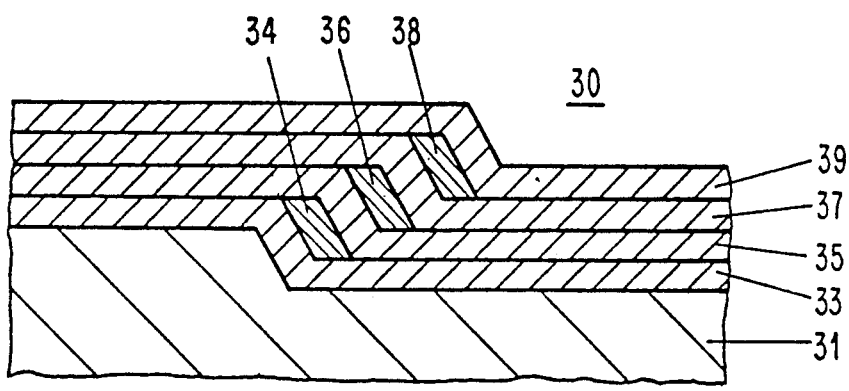
FIG. 3 is a cross-sectional representation of a first embodiment of an array of buried active layers produced in accordance with the invention.
Figure 4:
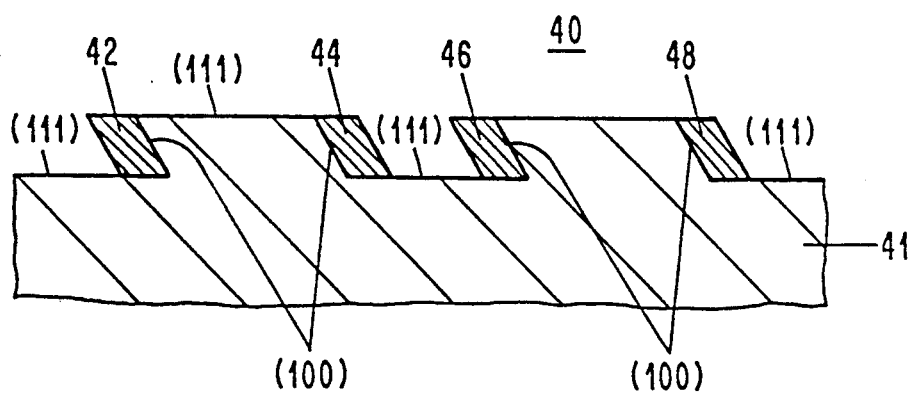
FIG. 4 is a cross-sectional representation of a second embodiment of an array of buried active layers produced in accordance with the invention.

For a variety of advanced semiconductor devices such as FETs or diode lasers, it is desirable to realize a plurality of closely spaced or periodic embedded layers or channels. FIGS. 3 and 4 show examples of structures having closely spaced layers. These structures can be produced in accordance with without requiring any high resolution lithography.

The process steps for these structures are essentially the same as those explained in connection with FIGS. 1A through 1G with the following deviations:

For the structure of FIG. 3, the steps "growth of layer 14" and "growth of conformal layer 15", as illustrated in FIGS. 1F and 1G, respectively, need to be repeated for each additional active layer or channel desired. The completed structure 30 then consists of a stack of conformal layers 33, 35, 37 and 39, deposited on substrate 31 and completely embedding the active layers 34, 36 and 38.

The structure 40, shown in FIG. 4, comprises an array of active channels 42, 44, 46 and 48, each of which is produced in accordance with the process used to fabricate layer 14 of the structure illustrated in FIG. 1G. In producing structure 40, a plurality of grooves is etched into substrate 41 and, contrary to the above described processes, the active layers are deposited at both sidewalls or facets of the grooves. For simplicity, no conformal layers, embedding layers 42, 44, 46 and 48, are shown in FIG. 4.

Figure 5:
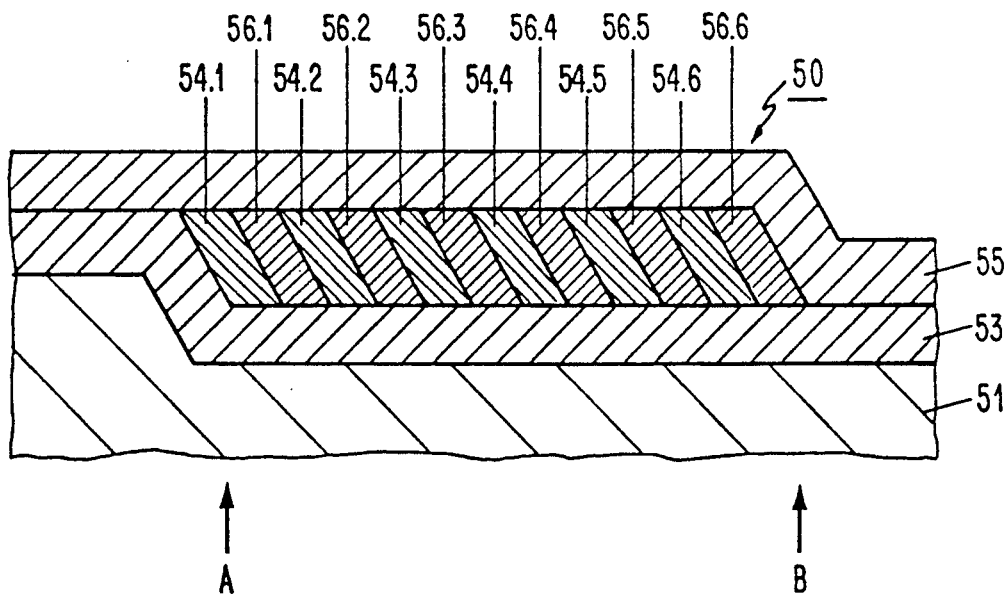
FIG. 5 is a cross-sectional representation of a structure with an array of laterally stacked ternary GaInAs and quaternary GaInAsP layers fully embedded into InP layers.

Another important application of the present invention will now be outlined with the aid of the structure schematically shown in FIG. 5.

Since both, ternary GaInAs and quaternary GaInAsP layers show crystal plane selective growth, the inventive method allows the fabrication of laterally defined GaInAs/GaInAsP layer sequences which can then be embedded by a conformally grown InP layer.

The process steps for the structure of FIG. 5 are again essentially the same as those explained in connection with FIGS. 1A through 1G. This with the exception that the step "growth of active layer 14", illustrated in FIG. 1F, is repeated while periodically changing the composition of the deposited compound from GaInAs to GaInAsP and vice versa until the required number of "pairs" is obtained. This layer sequence can then be embedded by conformally growing InP corresponding to the process leading to the structure of FIG. 1G. The completed structure 50, deposited on substrate 51, then consists of laterally stacked pairs of GaInAs and GaInAsP layers 54.1/56.1, 54.2/56.2 ... 54.6/56.6 that are embedded in InP conformal layers 53 and 55.

The lateral sequence of GaInAs/GaInAsP layers provides for modulation of (1) the refractive index, a feature of great importance for distributed feedback reflectors, and (2) the bandgap, which is highly desirable for certain advanced devices such as quantum well wire devices requiring high filling factors.

For quantum well wire lasers, the lateral stack of GaInAs/GaInAsP layers can be directly embedded into n and p-type InP cladding layers (53,55) which act as optical confinement and as injectors for minority carriers. The composition of GaInAsP can be adjusted to any desired lattice matched bandgap (e.g. 1 eV). The actual laser element can be obtained by cleaving or etching the structure of FIG. 5 at the planes designated A and B.

From the structures illustrated in FIGS. 3, 4 and 5, and from the respective discussions, it is evident that extremely dense packed, closely spaced sequences of ultra-thin III-V layers are achievable.

The key aspects of the above described invention can be summarized as follows:

Using an advanced growth technique such as MOVPE, which allows precise control of layer thicknesses in the Angstrom range, and combining the conformal growth and the plane dependent growth features of suitable material systems with a substrate orientation in a non-growth direction, geometrically well defined embedded layers with quantum well vertical and lateral dimensions (below 50 nm) can be realized.

In contrast to structures grown using two or more growth steps with intermediate processing, the buried layers obtained with the inventive single growth step method are free of possible interface states that, otherwise, may seriously deteriorate device performance; in the case of diode lasers it is, e.g., known that interface states cause severe reliability problems.

Since MOVPE allows conformal growth on small dimension structures with high precision, accurately maintaining the defined underlying structure, periodic or quasi-periodic structures can be realized with a high degree of control of the geometry of the embedded layers.

We claim:

1. A method for the epitaxial growth of a semiconductor heterostructure on a structured semiconductor substrate, said heterostructure including at least one plane-selectively grown III-V compound buried active layer, said method comprising the steps of:

providing a semiconductor substrate having a crystal orientation such that the substrate surface is substantially parallel to a crystal plane on which the growth rate of said III-V compound material is low;

structuring the substrate surface to provide at least one well-defined inclined planar surface parallel to a crystal plane on which the III-V compound material will grow at a substantial rate; and growing, onto the structured substrate surface a sequence of semiconductor layers including
at least one active layer of said III-V compound material selectively and laterally grown by a gas phase epitaxy method directly onto the inclined planar surface or a surface parallel thereto, and
at least one non-selectively grown conformal layer of a material exhibiting a crystal plane dependent growth behavior different from that of the material of the active layer and covering at least the active layer.

2. A method as in claim 1 wherein a further conformal layer is grown onto the structured substrate surface prior to growing the active layer, whereby the active layer is completely embedded within the conformal layers.

3. A method as in claim 1 wherein the active layer consists of GaInAs and the conformal layer of InP.

4. A method as in claim 1 wherein the active layer consists of GaInP or AlGaInP and the conformal layer of GaAs.

5. A method for the epitaxial growth of a semiconductor heterostructure on a structured semiconductor substrate, said heterostructure including at least one plane-selectively grown III-V compound buried active layer, said method comprising the steps of:

providing a semiconductor substrate having a crystal orientation such that the substrate surface is substantially parallel to a crystal plane on which the growth rate of said III–V compound material is low;

structuring the substrate surface to provide at least one well-defined inclined planar surface parallel to a crystal plane on which the III-V compound material will grow at a substantial rate;

growing a first conformal layer onto the structured substrate surface, wherein the first conformal layer has a well-defined inclined planar surface parallel to a crystal plane on which the III-V compound material will grow at a substantial rate;

growing, onto the first conformal layer a sequence of semiconductor layers including at least one active layer of said III-V compound material selectively and laterally grown onto the inclined planar surface of the first conformal layer or a surface parallel thereto, and at least one non-selectively grown conformal layer of a material exhibiting a crystal plane dependent growth behavior different from that of the material of the active layer and covering at least the active layer; and repeating the sequence of growing an active layer and a conformal layer for each desired additional active layer, thereby producing a plurality of closely spaced buried active layers separated by conformal layers.

6. A method for the epitaxial growth of a semiconductor heterostructure on a structured semiconductor substrate, said heterostructure including at least one plane-selectively grown III-V compound buried active layer, said method comprising the steps of:

providing a semiconductor substrate having a crystal orientation such that the substrate surface is substantially parallel to a crystal plane on which the growth rate of said III-V compound material is low:

structuring the substrate surface to provide at least one well-defined inclined planar surface parallel to a crystal plane on which the III-V compound material will grow at a substantial rate; and growing, onto the structured substrate surface a sequence of semiconductor layers including at least one active layer of said III-V compound material selectively and laterally grown directly onto the inclined planar surface or a surface parallel thereto, and at least one non-selectively grown conformal layer of a material exhibiting a crystal plane dependent growth behavior different from that of the material of the active layer and covering at least the active layer, wherein an array of closely spaced buried active layers is produced by structuring the substrate surface so that a plurality of well-defined inclined planar surfaces is provided, parallel to a crystal plane on which said III-V compound material will grow at a substantial rate, onto which the active layers are simultaneously grown, followed by the growth of the conformal layer.

7. A method for the epitaxial growth of a semiconductor heterostructure on a structured semiconductor substrate, said heterostructure including at least one plane-selectively grown III-V compound buried active layer, said method comprising the steps of:

providing a semiconductor substrate having a crystal orientation such that the substrate surface is substantially parallel to a crystal plane on which the growth rate of said III-V compound material is low;

structuring the substrate surface to provide at least one well-defined inclined planar surface parallel to a crystal plane on which the III-V compound material will grow at a substantial rate; and growing, onto the structured substrate surface a sequence of semiconductor layers including at least one active layer of said III-V compound material selectively and laterally grown directly onto the inclined planar surface or a surface parallel thereto, and at least one non-selectively grown conformal layer of a material exhibiting a crystal plane dependent growth behavior different from that of the material of the active layer and covering at least the active layer, wherein a lateral stack of a plurality of adjoining active layers of varying physical properties is produced by repeating the step of selectively growing an active layer, with changing composition, and subsequent growing of the conformal layer.

8. A method as in claim 7 wherein the composition of the active layers changes periodically.

9. A method as in claim 7 wherein the layers of the stack of active layers consist of GaInAs and GaInAsP, respectively.

* * * * *